(12) United States Patent
Li et al.

(10) Patent No.: US 12,112,923 B2
(45) Date of Patent: Oct. 8, 2024

(54) REACTION CHAMBER LINING

(71) Applicant: JIANGSU LEUVEN INSTRUMENTS CO. LTD, Xuzhou (CN)

(72) Inventors: Na Li, Xuzhou (CN); Shiran Cheng, Xuzhou (CN); Haiyang Liu, Xuzhou (CN); Zhaochao Chen, Xuzhou (CN); Yonggang Hou, Xuzhou (CN); Chengyi Wang, Xuzhou (CN); Dongdong Hu, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 734 days.

(21) Appl. No.: 17/292,796

(22) PCT Filed: Sep. 18, 2019

(86) PCT No.: PCT/CN2019/106351
§ 371 (c)(1),
(2) Date: May 11, 2021

(87) PCT Pub. No.: WO2020/098371
PCT Pub. Date: May 22, 2020

(65) Prior Publication Data
US 2021/0398781 A1    Dec. 23, 2021

(30) Foreign Application Priority Data
Nov. 12, 2018 (CN) .......................... 201821855011.8

(51) Int. Cl.
*H01J 37/32* (2006.01)
(52) U.S. Cl.
CPC ... *H01J 37/32495* (2013.01); *H01J 2237/334* (2013.01)

(58) Field of Classification Search
CPC . H01J 37/32495; H01J 37/32458; H05H 7/14
See application file for complete search history.

(56) References Cited

U.S. PATENT DOCUMENTS

| 4,384,938 A | * | 5/1983 | Desilets | C23F 4/00 |
| | | | | 156/345.43 |
| 4,820,371 A | * | 4/1989 | Rose | H01J 37/3244 |
| | | | | 118/620 |

(Continued)

FOREIGN PATENT DOCUMENTS

| CN | 1333917 A | 1/2002 |
| CN | 101399197 A | 4/2009 |

(Continued)

OTHER PUBLICATIONS

International Search Report issued in corresponding International Application No. PCT/CN2019/106351; mailed Nov. 28, 2019; State Intellectual Property Office of the P.R. China, Beijing, China, 8 pgs.

(Continued)

*Primary Examiner* — Michael C Romanowski
(74) *Attorney, Agent, or Firm* — HAUPTMAN HAM, LLP

(57) ABSTRACT

A reaction chamber lining including an annular side wall and a flange arranged on an upper portion of the side wall. An end face of the flange extends from the side wall in a radial direction, an outer edge of the flange extends in the radial direction to form fixing flanging parts, and a hole is in each of the fixing flanging parts. The side wall includes a rectangular slot, and a position of the rectangular slot corresponds to a position of a robotic arm access hole in a side wall of a reaction chamber. The side wall includes through holes and honeycomb-shaped apertures. A face joined to the bottom of the side wall includes a disc extending inwards in the radial direction, an extending end of the disc is fitted with (Continued)

an outer edge of an electrode assembly. A plurality of circles of slotted holes are in the disc.

7 Claims, 3 Drawing Sheets

(56) References Cited

U.S. PATENT DOCUMENTS

| | | | | |
|---|---|---|---|---|
| 5,605,637 | A * | 2/1997 | Shan | H01J 37/32477 156/345.47 |
| 5,820,723 | A * | 10/1998 | Benjamin | H01L 21/67748 118/728 |
| 5,985,033 | A * | 11/1999 | Yudovsky | H01L 21/68735 118/728 |
| 6,027,604 | A * | 2/2000 | Lim | H01L 21/67069 118/724 |
| 6,090,210 | A * | 7/2000 | Ballance | H01L 21/67115 239/596 |
| 6,129,808 | A * | 10/2000 | Wicker | H01J 37/321 156/914 |
| 6,170,429 | B1 * | 1/2001 | Schoepp | H01J 37/32495 118/723 R |
| 6,178,919 | B1 * | 1/2001 | Li | H01J 37/32165 156/345.47 |
| 6,296,747 | B1 * | 10/2001 | Tanaka | C23C 14/345 204/298.14 |
| 6,408,786 | B1 * | 6/2002 | Kennedy | C23C 16/507 118/724 |
| 6,821,378 | B1 * | 11/2004 | Daugherty | H01J 37/32449 118/724 |
| 7,166,166 | B2 * | 1/2007 | Saigusa | H01J 37/32431 118/724 |
| 7,552,521 | B2 * | 6/2009 | Fink | H01J 37/32623 118/715 |
| 8,118,938 | B2 * | 2/2012 | Carducci | H01J 37/32082 118/728 |
| 8,152,925 | B2 * | 4/2012 | Iizuka | H01J 37/32449 118/715 |
| 8,360,003 | B2 * | 1/2013 | Nguyen | H01J 37/321 156/345.47 |
| 9,129,778 | B2 * | 9/2015 | Huseinovic | C23C 16/45565 |
| 9,184,028 | B2 * | 11/2015 | Dhindsa | H01J 37/32715 |
| 10,145,012 | B2 * | 12/2018 | Je | C23C 16/45565 |
| 10,504,719 | B2 * | 12/2019 | Goel | C23C 14/541 |
| 2004/0069223 | A1 * | 4/2004 | Tzeng | H01J 37/32477 156/345.1 |
| 2004/0092120 | A1 * | 5/2004 | Wicker | H01J 37/32495 438/723 |
| 2004/0238123 | A1 * | 12/2004 | Becknell | H01J 37/32844 156/345.33 |
| 2005/0225248 | A1 * | 10/2005 | Fink | H01J 37/32458 315/111.21 |
| 2005/0241767 | A1 * | 11/2005 | Ferris | H01J 37/32633 156/345.35 |
| 2006/0151114 | A1 * | 7/2006 | Fink | H01J 37/3244 118/715 |
| 2007/0221130 | A1 * | 9/2007 | Nozawa | C23C 16/4412 118/719 |
| 2011/0290419 | A1 * | 12/2011 | Horiguchi | H01J 37/32568 118/723 E |
| 2012/0018402 | A1 * | 1/2012 | Carducci | H01J 37/32082 427/523 |
| 2012/0225566 | A1 * | 9/2012 | Hamano | H01J 37/32669 257/E21.24 |
| 2012/0273130 | A1 * | 11/2012 | Drewery | H01J 37/32651 361/816 |
| 2013/0105085 | A1 * | 5/2013 | Yousif | H01L 21/67103 118/724 |
| 2014/0030486 | A1 * | 1/2014 | Sun | H01J 37/32495 428/697 |
| 2017/0256383 | A1 * | 9/2017 | Liao | H01J 37/32082 |
| 2018/0061618 | A1 * | 3/2018 | Nichols | H01J 37/32807 |
| 2018/0174869 | A1 * | 6/2018 | Ha | C23C 16/4411 |
| 2018/0374722 | A1 * | 12/2018 | Isago | H01J 37/32458 |
| 2020/0243307 | A1 * | 7/2020 | Bise | H01J 37/32449 |
| 2021/0225616 | A1 * | 7/2021 | Peng | C23C 16/4404 |

FOREIGN PATENT DOCUMENTS

| | | | |
|---|---|---|---|
| CN | 201584396 U | | 9/2010 |
| CN | 203481181 U | * | 3/2014 |
| CN | 103891417 A | | 6/2014 |
| CN | 208835019 U | | 5/2019 |
| KR | 10-2001-0079914 A | | 8/2001 |
| WO | WO-2009115005 A1 | * | 9/2009 ......... H01J 37/32623 |
| WO | 2015135350 A | | 9/2015 |

OTHER PUBLICATIONS

Written Opinion issued in corresponding International Application No. No. PCT/CN2019/106351; mailed Nov. 28, 2019; State Intellectual Property Office of the P.R. China, Beijing, China, 8 pgs.

* cited by examiner

REACTION CHAMBER LINING

RELATED APPLICATIONS

The present application is a U.S. National Phase of International Application Number PCT/CN2019/106351 filed Sep. 18, 2019 and claims priority to Chinese Application Number 201821855011.8 filed Nov. 12, 2018.

BACKGROUND OF THE INVENTION

Field of the Invention

The present utility model relates to the technical field of a semiconductor, and in particular, to a reaction chamber lining.

Description of Related Art

In semiconductor manufacturing, plasma etching is used to etch conductive and dielectric materials. One of the problems of plasma etching is that, over time, when a plurality of wafers are processed in a trench, a layer of film will be deposited on a chamber wall of a processing chamber. The accumulation of this film may cause the following problems: firstly, the film may peel off from the chamber wall and introduce particles. As a feature dimension of integrated circuit devices continues to decrease, the tolerance degree of particles in the processing process is rapidly decreasing. Therefore, it is becoming more and more important to avoid the generation and refinement of the particles in the processing process. Secondly, the film may change radio frequency grounding paths, thereby influencing the results obtained on the wafer. At present, the equipment mostly uses wet cleaning operation on a process chamber, and a physical method is used to scrub an inner wall of a reaction chamber to remove an accumulation layer.

In commercial semiconductor manufacturing, wet cleaning of the process chamber is undesirable. For this reason, some process chambers are provided with linings to protect chamber walls. However, there are at least two major disadvantages of using cylindrical linings in process chambers at present. The first disadvantage is that due to poor heat transfer in vacuum, the whole of such a lining is located in vacuum, and enough heat connection is lacked. Therefore, when radio frequency power is cycled and turned off, the temperature of the lining will fluctuate drastically. Such temperature fluctuations may cause undesirable changes. In the wafer processing process, the second disadvantage is that it is difficult to realize electrical connection with the lining in vacuum for providing satisfactory radio frequency grounding paths. Materials singly used for this purpose, such as stainless steel screws, copper tapes and copper-plated fingers, may all cause contaminants on the wafer. For the above reasons, it is necessary to provide a novel semiconductor process reaction chamber lining.

SUMMARY OF THE INVENTION

By aiming at the existing problem, the present utility model provides a reaction chamber lining, including an annular side wall main body (2) and a flange (3) arranged on an upper portion of the side wall main body (2), wherein an end face of the flange (3) extends out of the side wall (2) in a radial direction, an outer edge of the flange (3) extends in the radial direction to form fixing flanging parts (31), and a hole (32) is provided in each of the fixing flanging parts; the side wall (2) is provided with a rectangular slot (4), and a position of the rectangular slot corresponds to a position of a robotic arm access hole (51) in a side wall of a reaction chamber (50); the side wall (2) is provided with through holes (22) and honeycomb-shaped apertures (21); and a face joined to the bottom of the side wall (2) is provided with a disc (5) extending inwards in the radial direction, an extending end of the disc (5) is fitted with an outer edge of an electrode assembly (80) arranged at the center of the reaction chamber (50), and a plurality of circles of slotted holes (6) are annularly provided in the disc (5).

In the reaction chamber lining of the present utility model, preferably, the end face of the flange (3) is circular or square.

In the reaction chamber lining of the present utility model, preferably, the end face of the flange (3) extends out of the side wall (2) in the radial direction for a length of 6 mm to 35 mm and a thickness of 5 mm to 10 mm.

In the reaction chamber lining of the present utility model, preferably, the end face of the flange (3) is provided with a sealing groove (33) and a conductive coil accommodating groove (34) to implement good contact and sealing between the reaction chamber lining (1) and a chamber cover assembly (60) at an upper portion of the reaction chamber (50).

In the reaction chamber lining of the present utility model, preferably, dimensions of the rectangular slot (4) are the same as or slightly smaller than dimensions of the robotic arm access hole (51) so that a robotic arm is able to enter and extend out of the reaction chamber (50) to fetch and deliver a wafer.

In the reaction chamber lining of the present utility model, preferably, an aperture diameter of the honeycomb-shaped apertures (21) ranges from 1.5 mm to 3 mm.

In the reaction chamber lining of the present utility model, preferably, a thickness of the disc (5) ranges from 3 mm to 7 mm.

In the reaction chamber lining of the present utility model, preferably, a width of the slotted holes (6) ranges from 3 mm to 5 mm, each circle is provided with a plurality of slotted holes (6), and a length of each of the slotted holes (6) is a length of an arc with an angle between 20° and 40°.

In the reaction chamber lining of the present utility model, preferably, a gap between two adjacent circles of slotted holes (6) ranges from 1 mm to 2.5 mm, and the two adjacent circles of slotted holes (6) are distributed in a staggered manner.

In the reaction chamber lining of the present utility model, preferably, a material of the reaction chamber lining is aluminum, ceramic or quartz.

The reaction chamber lining of the present utility model can provide better thermal stability, enough radio frequency grounding lines, and usability of the shortest downtime, can reduce the obstruction of reaction airflow during flowing in a vacuum chamber, and can more easily reach a vacuum degree required by equipment.

BRIEF DESCRIPTION OF THE DRAWINGS

In order to more clearly illustrate the technical solutions of the specific implementations of the present utility model, a brief introduction to the accompanying drawings required in the description of the specific implementations is provided hereafter.

In the drawings.

1 denotes a reaction chamber lining; 2 denotes a side wall; 21 denotes a honeycomb-shaped aperture; 22 denotes a through hole; 3 denotes a flange; 31 denotes a flanging part; 32 denotes a hole; 33 denotes a sealing groove; 34 denotes a conductive coil accommodating groove; 4 denotes a rectangular slot; 5 denotes a disc; 6 denotes a slotted hole; 50 denotes a reaction chamber; 51 denotes a robotic arm access hole; 60 denotes a chamber cover assembly; 70 denotes a wafer; and 80 denotes an electrode assembly.

DETAILED DESCRIPTION OF THE EMBODIMENTS

The technical solution of the present utility model will be clearly and completely described with reference to the accompanying drawings hereinafter. Obvious, the described implementations are part of implementations of the present utility model, not all of them. Based on the implementations in the present utility model, all other implementations obtained by a person skilled in the art without any inventive efforts are all within the protection scope of the present utility model.

In the descriptions of the present utility model, it should be noted that terms "center", "upper", "lower", "left", "right", "vertical", "horizontal", "inner", "outer", etc. indicating the orientation or the positional relationship are based on the orientation or the positional relationship shown in the accompanying drawings, are only for convenience of describing the present utility model and simplifying the descriptions, are not intended to indicate or imply that the referenced apparatus or element must have a particular orientation, be constructed and operated in a particular orientation, and therefore cannot be understood as a limitation of the present utility model. Additionally, terms "first", "second" and "third" are only used for purposes of description, and cannot be understood as indicating or implying relative importance.

In the descriptions of the present utility model, it should be noted that unless otherwise clearly specified and defined, terms "install", "interconnect" and "connect" should be understood in a broad sense, for example, it may be connected in a fixed, detachable or integrated manner; it may be mechanically or electrically connected; it may be directly connected or indirectly connected via an intermediate media; and it may be communication inside two elements. For those of ordinary skill in the art, the specific meaning of the above-mentioned terms in the present utility model may be understood according to specific circumstances.

Figure 1:
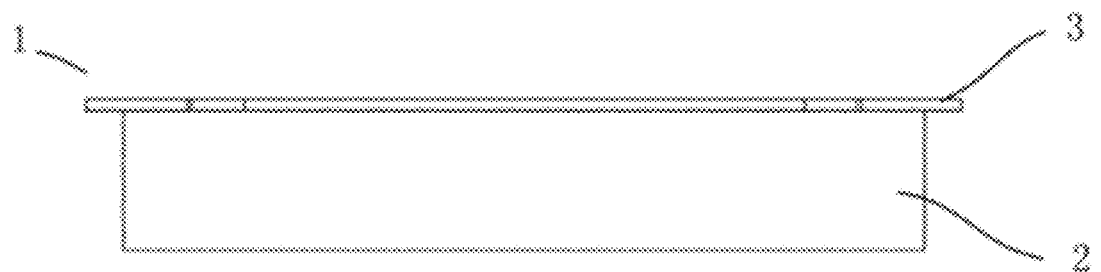
FIG. 1 is a front view of a reaction chamber lining of the present utility model.
Figure 2:
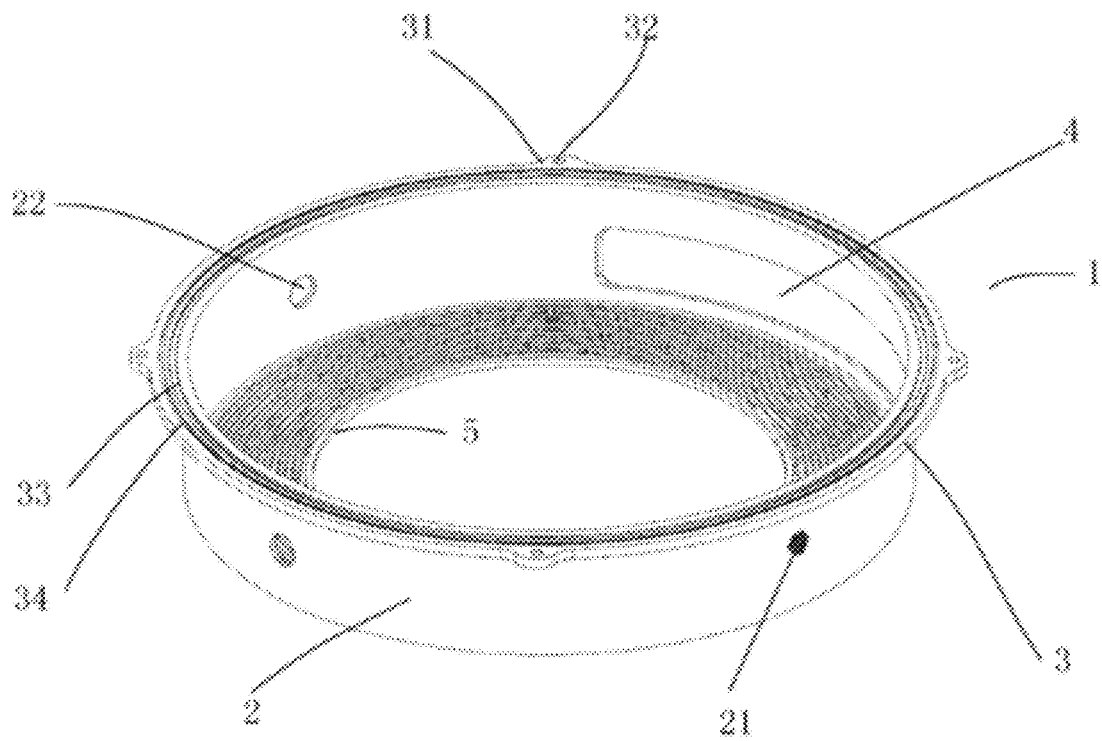
FIG. 2 is a schematic three-dimensional structure diagram of the reaction chamber lining of the present utility model.
Figure 3:
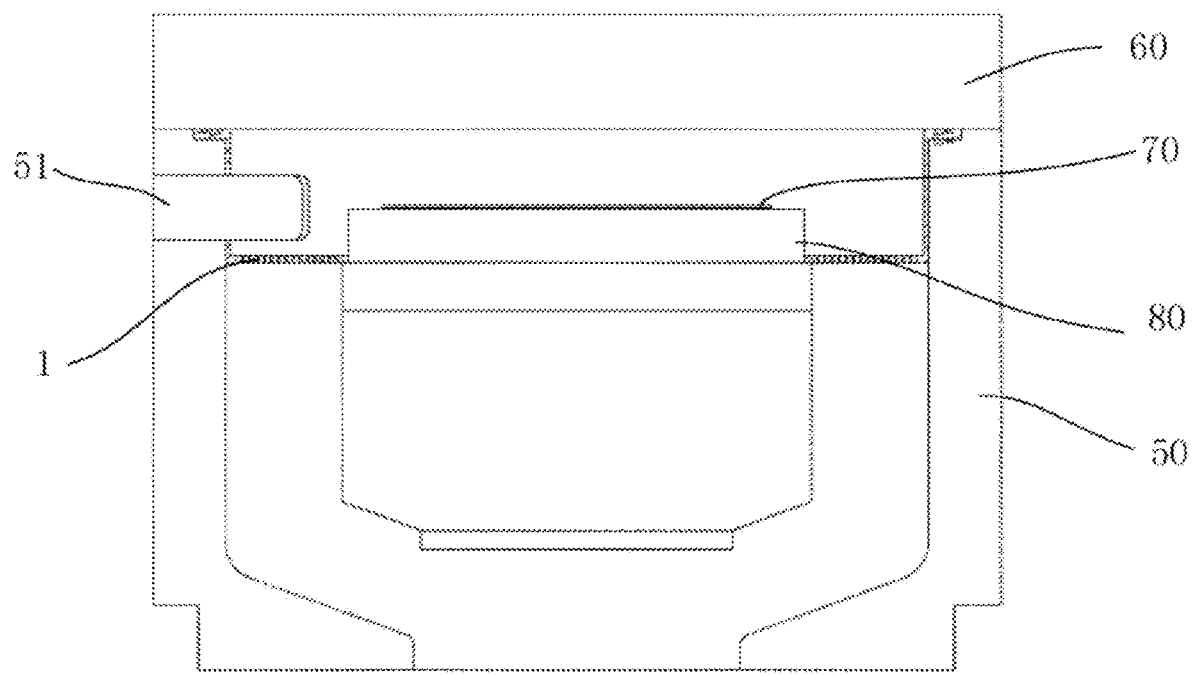
FIG. 3 is a schematic installation diagram of the reaction chamber lining of the present utility model.

The present utility model will be further described in detail through specific implementations in conjunction with the accompanying drawings. FIG. 1 is a front view of a reaction chamber lining of the present utility model. FIG. 2 is a schematic three-dimensional structure diagram of the reaction chamber lining of the present utility model. FIG. 3 is a schematic installation diagram of the reaction chamber lining of the present utility model. As shown in FIG. 1 to FIG. 3, a reaction chamber lining 1 includes an annular side wall main body 2 and a flange 3 arranged on an upper portion of the side wall main body. An end face of the flange 3 extends out of the side wall 2 in a radial direction for a length of 6 mm to 35 mm and a thickness of 5 mm to 10 mm. The end face of the flange 3 is circular or square, and is adjusted in a manner of being matched with the shape of the chamber. An outer edge of the flange 3 extends in the radial direction to form fixing flanging parts 31, the quantity of the flanging parts 31 may be 2 to 4, a hole (32) is provided in each of the fixing flanging parts, and a screw may pass through the hole 32 to fix the reaction chamber lining 1 onto an upper surface of the reaction chamber 50. Therefore, good grounding and sufficient contact between the reaction chamber lining 1 and the reaction chamber 50 are ensured. Additionally, according to an installation position of the reaction chamber lining 1 in equipment, under some conditions, the end face of the flange 3 may be provided with a circle of sealing groove 33 and a conductive coil accommodating groove 34 to implement good contact and sealing between the reaction chamber lining 1 and a chamber cover assembly 60 at an upper portion of the reaction chamber 50.

As shown in FIG. 2 and FIG. 3, the side wall 2 is provided with a rectangular slot 4, and a position of the rectangular slot corresponds to a position of a robotic arm access hole 51 in a side wall of the reaction chamber 50, dimensions of the rectangular slot 4 are the same as or slightly smaller than dimensions of the robotic arm access hole 51 so that a robotic arm is able to enter and extend out of the reaction chamber 50 to fetch and deliver a wafer. In the technical processing process, a wafer 70 is placed into the chamber through the robotic arm access hole 51 and the rectangular slot 4 by the robotic arm from the outside of the reaction chamber 50, and the wafer 70 is taken down by an ejector needle ascending and descending mechanism from the robotic arm to be placed to an upper surface of an electrode assembly 80.

As shown in FIG. 2, the side wall 2 is provided with honeycomb-shaped apertures 21 and through holes 22. The through holes 22 may be used as observing holes, and correspond to observing holes provided in the side wall of the reaction chamber 50, so as to enable an operator to be able to observe conditions inside the reaction chamber through the through holes. According to different properties of an externally connected device of the reaction chamber, the through holes 22 may be round holes or honeycomb-shaped holes. The reaction chamber 50 needs to be externally connected with a vacuum measuring device in the technical process, so as to measure and monitor the vacuum degree in the chamber or the chamber pressure in the technical process in real time. Therefore, a plurality of relatively big round through holes are provided in the side wall of the reaction chamber 50 to connect the inside and the outside of the chamber. Positions of the honeycomb-shaped apertures 21 correspond to the big round through holes, the distribution quantity of the honeycomb-shaped apertures may be determined by the quantity of the vacuum measuring devices externally connected to the side wall of the reaction chamber. A coverage range of the honeycomb-shaped apertures 21 should be equal to or a little smaller than that of open holes provided in the side wall of the corresponding position of the reaction chamber 50, so that to enable an inner wall of the reaction chamber 50 not to be exposed in plasmas to avoid pollution. Through the characteristics of the honeycomb-shaped apertures, the influence caused by particle impurities and the like generated in the technical process on the measuring performance of the vacuum measuring device can be blocked and prevented from entering the vacuum measuring device, so that the service life of the vacuum measuring device is prolonged. A dimension of the honeycomb-shaped apertures 21 ranges from 1.5 to 3 mm.

Figure 4:
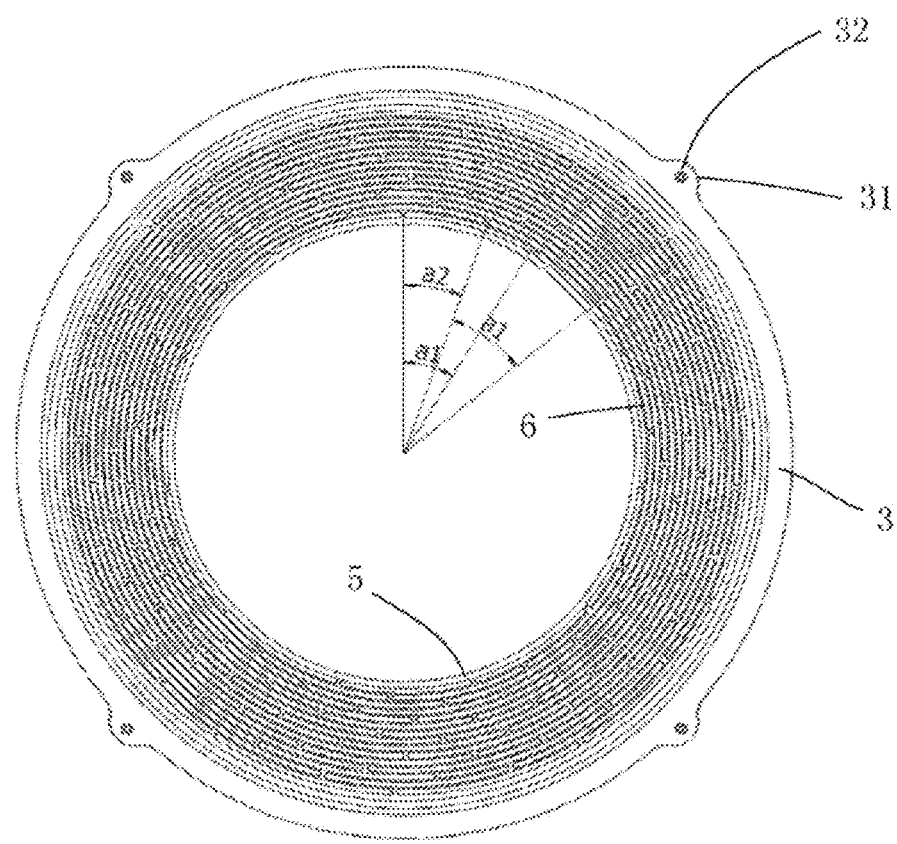
FIG. 4 is a top view of the reaction chamber lining of the present utility model.
Figure 5:
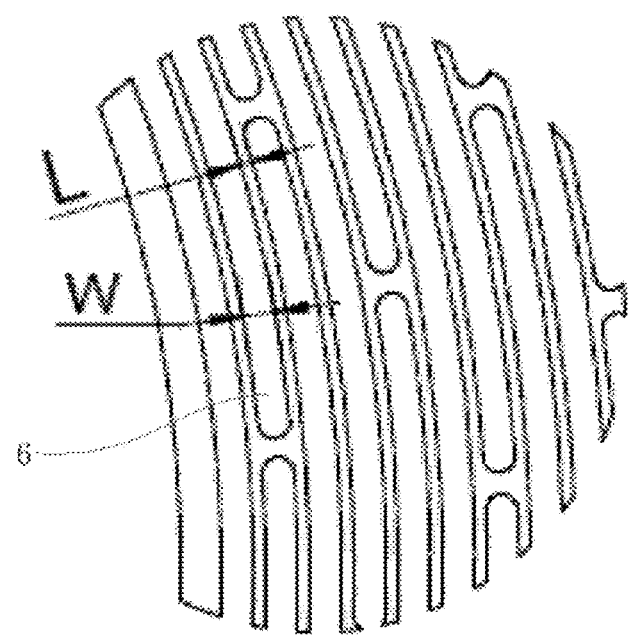
FIG. 5 is a partial view of slotted holes of the reaction chamber lining of the present utility model.

As shown in FIG. 2 and FIG. 3, a face joined to the bottom of the side wall 2 is provided with a disc 5 extending inwards in the radial direction, and a thickness of the disc 5 ranges from 3 mm to 7 mm. An extending end of the disc 5 is fitted with an outer edge of an electrode assembly 80 arranged at the center of the reaction chamber in a manner of being attached to each other or forming a certain distance. FIG. 4 is a top view of the reaction chamber lining of the present utility model. FIG. 5 is a partial view of slotted holes of the reaction chamber lining of the present utility model. As shown in FIG. 4 and FIG. 5, a plurality of circles of slotted holes 6 are annularly provided in the disc 5. According to different dimensions of the installed reaction chambers, the number of circles of the slotted holes 6 distributed in the radial direction is adjusted. A width W of the slotted holes 6 ranges from 3 mm to 5 mm, and each circle is provided with a plurality of slotted holes 6. The quantity of the slotted holes 6 in each circle is determined according to a length of the slotted holes 6 and a perimeter of the disc 5. As shown in FIG. 4, the two ends of the slotted holes 6 are respectively connected to a circle center, an angle between two connecting lines is a1, and the length of the slotted holes 6 is the length of an arc with the angle a1. Preferably, the angle a1 ranges from 20° to 40°.

A gap L between two adjacent circles of slotted holes 6 ranges from 1 mm to 2.5 mm, and as shown in FIG. 5, the two adjacent circles of slotted holes 6 are distributed in a staggered manner. Specifically, as shown in FIG. 4, an angle from an initial position of the first circle of slotted hole 6 to an initial position of the adjacent inner circle of slotted hole 6 is a2, and a2 ranges from 0° to 40°. By adopting such an arrangement mode, the slotted holes 6 are distributed in a more staggered mode, and a better flow homogenizing effect can be achieved. Additionally, ignition caused by entering of the plasmas in the reaction chamber into a position below a reaction region through the slotted holes 6 is prevented. At the same time, the mechanical strength of the disc 5 portion is enhanced. Through such a design, the flow field distribution of a plasma gas flowing through a wafer surface is improved to a great degree, and the process result uniformity of the plasma reaction is improved.

A material of the reaction chamber lining 1 may be aluminum, ceramic, quartz and the like. When the reaction chamber lining 1 uses a metal material, for example, when the reaction chamber lining is processed by aluminum, the reaction chamber lining 1 is placed inside the reaction chamber 50. According to technical requirements, positions of the reaction chamber lining 1 exposed in the plasmas need to be subjected to anti-corrosion surface treatment such as hard anodizing. During installation, the outer wall of the reaction chamber lining 1 is attached to the inner wall of the reaction chamber 50, but the attachment is not tight, so as to avoid the clamping or separation incapability of the reaction chamber 50 and the reaction chamber lining 1 due to expansion effects under a temperature rise condition.

Finally, it should be noted that the above embodiments are merely illustrative of the technical solutions of the present utility model, but are not intended to limit the present utility model; although the present utility model has been described in detail with the reference to the foregoing embodiments, those of ordinary skill in the art should understand that: the technical solutions of each of the above embodiments can still be modified, or some or all of the technical features in the above embodiments can be equivalently replaced; and these modifications or substitutions do not depart from the scope of the technical solutions of each embodiment of the present utility model.

What is claimed is:

1. A reaction chamber lining, comprising:
    an annular side wall main body and a flange arranged on an upper portion of the annular side wall main body, wherein an end face of the flange extends out of the side wall in a radial direction, an outer edge of the flange extends in the radial direction to form fixing flanging parts, and a hole is provided in each of the fixing flanging parts;
    the side wall is provided with a rectangular slot for alignment with a robotic arm access hole of a reaction chamber; the side wall is provided with through holes and honeycomb-shaped apertures;
    and a face joined to a bottom of the side wall is provided with a disc extending inwards in the radial direction, an extending end of the disc is for fitting with an outer edge of an electrode assembly arranged at the center of a reaction chamber, and a plurality of circles of slotted holes are annularly provided in the disc,
    a width of the slotted holes ranges from 3 mm to 5 mm, each circle is provided with a plurality of slotted holes, and a length of each of the slotted holes is a length of an arc with an angle between 20° and 40°,
    a gap between two adjacent circles of slotted holes ranges from 1 mm to 2.5 mm, and the two adjacent circles of slotted holes are distributed in a staggered manner, and
    an angle from an initial position of a first circle of slotted holes to an initial position of an adjacent inner circle of slotted holes ranges from 0° to 40°.

2. The reaction chamber lining according to claim 1, wherein
    the end face of the flange is circular or square.

3. The reaction chamber lining according to claim 1, wherein
    the end face of the flange extends out of the side wall in the radial direction for a length of 6 mm to 35 mm and a thickness of 5 mm to 10 mm.

4. The reaction chamber lining according to claim 1, wherein the end face of the flange is provided with a sealing groove and a conductive coil accommodating groove to implement contact and sealing between the reaction chamber lining and a chamber cover assembly at an upper portion of a reaction chamber.

5. The reaction chamber lining according to claim 1, wherein
    an aperture diameter of the honeycomb-shaped apertures ranges from 1.5 mm to 3 mm.

6. The reaction chamber lining according to claim 1, wherein
    a thickness of the disc ranges from 3 mm to 7 mm.

7. The reaction chamber lining according to claim 1, wherein
    a material of the reaction chamber lining is aluminum, ceramic or quartz.

* * * * *